United States Patent [19]
Mori et al.

[11] Patent Number: 4,695,725
[45] Date of Patent: Sep. 22, 1987

[54] METHOD OF DETECTING A FOCUS DEFECT OF AN ELECTRON MICROSCOPE IMAGE

[75] Inventors: Nobufumi Mori; Yuichi Hosoi; Kenji Takahashi; Junji Miyahara, all of Kanagawa, Japan

[73] Assignee: Fuji Photo Film Co., Ltd., Japan

[21] Appl. No.: 806,466

[22] Filed: Dec. 9, 1985

[30] Foreign Application Priority Data

Dec. 10, 1984 [JP] Japan ................... 59-260517
Apr. 12, 1985 [JP] Japan ................... 60-78079

[51] Int. Cl.[4] ...................... H01J 37/21; H01J 37/153
[52] U.S. Cl. ................... 250/327.2; 250/311; 250/397
[58] Field of Search ............ 250/327.2, 337, 484.1, 250/397, 311

[56] References Cited

U.S. PATENT DOCUMENTS

| 3,859,527 | 1/1975 | Luckey | 250/327.2 |
| 4,236,078 | 11/1980 | Kotera et al. | 250/363 R |
| 4,239,968 | 12/1980 | Kotera et al. | 250/327.2 |
| 4,258,264 | 3/1981 | Kotera et al. | 250/484.1 |
| 4,276,473 | 6/1981 | Kato et al. | 250/327.2 |
| 4,315,318 | 2/1982 | Kato et al. | 364/515 |
| 4,336,154 | 6/1982 | Nishimura et al. | 252/301.4 H |
| 4,387,428 | 6/1983 | Ishida et al. | 364/414 |
| 4,394,581 | 7/1983 | Takahashi et al. | 250/484.1 |
| 4,400,619 | 8/1983 | Kotera et al. | 250/327.2 |
| 4,505,989 | 3/1985 | Umemoto et al. | 428/691 |
| 4,527,061 | 7/1985 | Horikawa et al. | 250/327.2 |
| 4,539,138 | 9/1985 | Miyahara et al. | 252/301.4 H |
| 4,631,407 | 12/1986 | Kawajiri et al. | 250/327.2 |
| 4,651,220 | 3/1987 | Hosoi et al. | 358/256 |

FOREIGN PATENT DOCUMENTS

| 55-47719 | 4/1980 | Japan . |
| 55-47720 | 4/1980 | Japan . |
| 56-116777 | 9/1981 | Japan . |
| 57-23675 | 2/1982 | Japan . |
| 58-121874 | 7/1983 | Japan . |
| 59-56479 | 3/1984 | Japan . |
| 61-93538 | 5/1986 | Japan . |

OTHER PUBLICATIONS

G. L. Christner and E. L. Thomas, "Visualization of Polymer Interfaces by Phase Contrast ('defocus') Electron Microscopy", *Journal of Applied Physics*, vol. 48, No. 10 (Oct. 1977), pp. 4063-4067.
J. Frank, "Controlled Focusing and Stigmating in the Conventional and Scanning Transmission Electron Microscope", *Journal of Physics E: Scientific Instruments*, vol. 8 (1975), pp. 582-587.
"Journey to Gene Observation", Ed. Hideo Yamagishi, publ., University of Tokyo, Publishing Society.

*Primary Examiner*—Janice A. Howell
*Assistant Examiner*—Constantine Hannaher
*Attorney, Agent, or Firm*—Gerald J. Ferguson, Jr.; Michael P. Hoffman; Ronni S. Malamud

[57] ABSTRACT

A two-dimensional image sensor is exposed under vacuum to an electron beam having passed through a specimen in an electron microscope to enable the image sensor to store the energy of the electron beam. Then, stimulating energy is applied to the image sensor to discharge the stored energy as light. The light discharged from the image sensor is photoelectrically detected to produce an image signal. A defocus value of the image is detected on the basis of the image signal. The image signal is also subject electrically to the Fourier transform to produce a converted image signal indicative of a ring pattern. The degree of one ring, the length of minor and major axes of the ring, and the angle of inclination of the major axis are computed from the converted image signal for computing currents to be fed to a stigmeter of the electron microscope to eliminate astigmatism.

10 Claims, 6 Drawing Figures

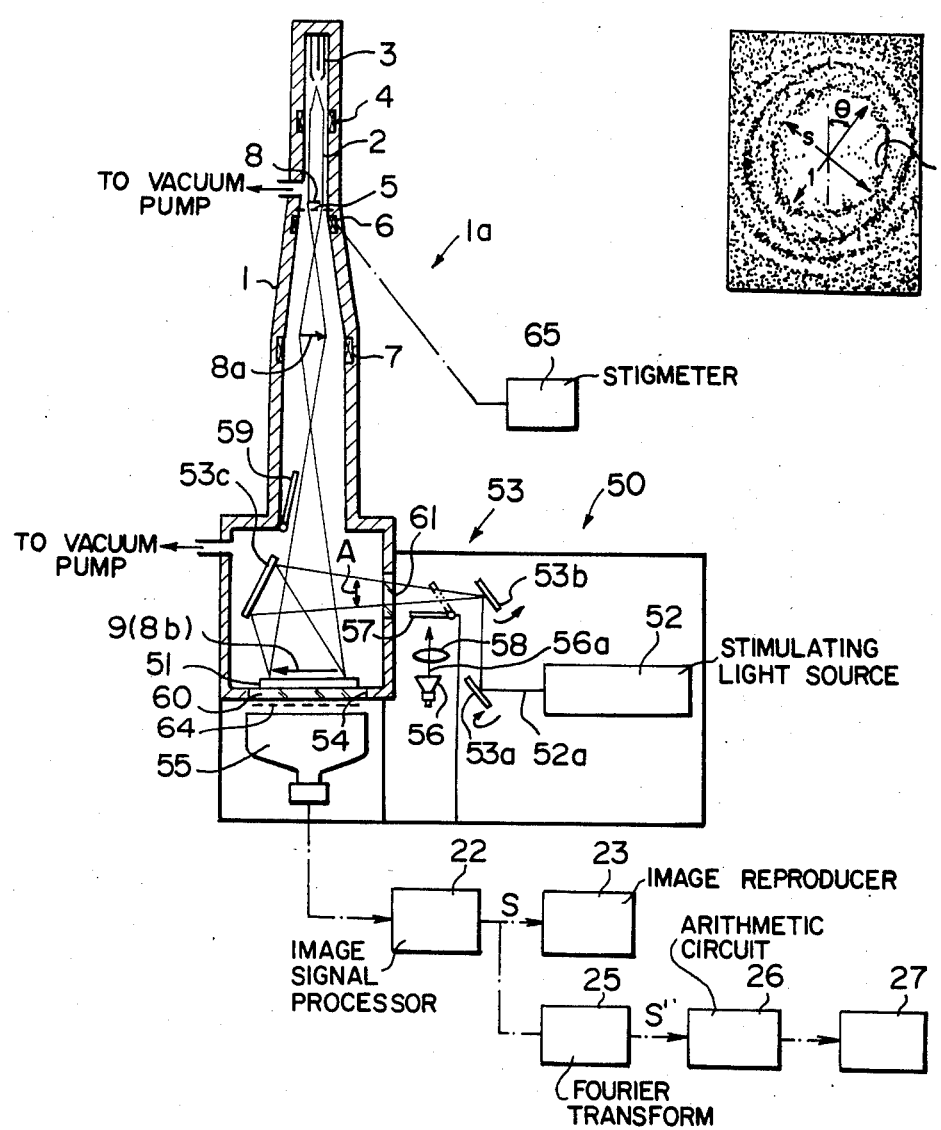

METHOD OF DETECTING A FOCUS DEFECT OF AN ELECTRON MICROSCOPE IMAGE

BACKGROUND OF THE INVENTION

1. Field of the Invention

The present invention relates to a method of detecting a focus defect such as a defocus value or astigmatic error of an electron microscope image for the purpose of correcting the focus defect, and more particularly to a method of detecting such a focus defect by recording an electron microscope image with high sensitivity on a two-dimensional image sensor such as a stimulable phosphor sheet, applying stimulating light or heat to the two-dimensional image sensor to cause the same to emit light, photoelectrically reading the emitted light to produce an image signal, and computing the focus defect from the image signal for the purpose of correcting the focus defect.

2. Description of the Prior Art

There are known electron microscopes for obtaining a magnified image of a specimen by deflecting a beam of electrons transmitted through the specimen with an electric or magnetic field. As is well known, the electron beam having passed through the specimen forms a diffraction pattern on the rear focal plane of the objective lens, and the diffracted beams interfere with each other again to produce the magnified image of the specimen. The magnified specimen image can be observed as a transmission image by projecting the image onto a screen with a projector lens. Alternatively, the rear focal plane of the objective lens may be projected for enabling the user to observe the magnified diffraction pattern of the image. Where an intermediate lens is positioned between the objective lens and the projector lens, the magnified transmission image or the diffraction pattern may be produced selectively as desired by adjusting the focal length of the intermediate lens.

The magnified image or diffraction pattern (hereinafter referred to collectively as a "transmitted electron-beam image) is generally observed by exposing a photographic film placed in the image formation plane of the projector lens to the transmitted electron-beam image, or by amplifying the transmitted electron-beam image with an image intensifier for projection. When the transmitted electron-beam image or electron microscope image is thus to be recorded on a recording medium or displayed on a display device, it is necessary to focus the image sharply. One general practice has been for the operator to observe an electron microscope image focused by projecting the image onto a fluorescent screen and, while observing this image, to manually turn a focus control knob so as to reduce any defocus present. According to another image focusing practice, the electron microscope image is projected onto an image intensifier and picked up by a television camera for display on a display unit such as a CRT, and the operator turns the focus control knob to eliminate the defocus while observing the displayed image.

However, the prior focusing techniques have proven unsatisfactory for various reasons. In order to display the electron microscope image on the fluorescent screen for enabling the operator to recognize a defocus, the specimen should be exposed to a relatively large amount of electron beams and is therefore liable to be damaged thereby. The electron microscope image displayed on the image intensifier to achieve a focused condition cannot be observed well since the displayed image has a low degree of sharpness and tends to be distorted. Another problem is that sole reliance on manual operation of the focus control knob while observing the displayed image to attain a well-focused condition is time-consuming and requires a certain level of skill on the part of the operator.

It is known to determine the size of a fringe from an electron microscope image recorded and developed on a photographic film. It is also known to subject such a developed electron microscope image optically to the Fourier transform for the measurement of a defocus. According to these known methods, however, it is necessary to employ a film developing process and an optical system, and the procedure is quite complicated.

The electron microscope, like the optical microscope, is affected by astigmatism. If it is desired to produce electron microscope images of high resolution, the astigmatism should strictly be corrected since it will otherwise impair the image quality. There have widely been used electron microscopes equipped with a stigmeter capable of correcting the astigmatism. The stigmeter comprises coils through which currents flow in respective X- and Y-axis directions, the currents being variable for astigmatism correction.

Therefore, the currents to be passed through the coils in the X- and Y-axis directions must be properly selected dependent on the astigmatism to be corrected. It has been customary to select the stigmeter currents while observing the granularity of the image of an amorphous material projected onto the fluorescent screen of the electron microscope, or based on the symmetry of a fringe produced when the image is brought out of focus. Inasmuch as these practices rely on the skill of the electron microscope operator, however, the astigmatism may not be properly corrected at times. Thus the electron microscope operator should be highly skilled.

To eliminate these shortcomings, it has been attempted to determine the extent of astigmatism quantitatively by employing an optically converted graphic pattern or figure generated by the Fourier transform of the image of the amorphous material. This process is based on the fact that the concentric ring pattern in the optically converted figure becomes elliptical in shape when astigmatism is present. More specifically, the extent of astigmatism $\delta z$ is given by:

$$\delta z = (4n/\lambda M^2)(1/s^2 - 1/l^2) \qquad (1)$$

where n is the degree of a ring having an intensity 0, counting from the lower angle of the concentric ring pattern, s and l are the lengths of the minor and major axes of the ring, $\lambda$ is the wavelength of the electron beam, and M is the magnification of the image. If the angle formed between the x and y axes and any desired direction serving as a reference for measuring $\theta$ is $\pi/4$, then the currents $\delta I_x$, $\delta I_y$ to be passed through the stigmeter coils in the X- and Y-axis directions for eliminating the astigmatism $\delta z$ are expressed by:

$$\delta I_x = C\, \delta z \times \sin(|\theta - \alpha| - \pi/4) \qquad (2)$$

$$\delta I_y = C\, \delta z \times \sin(|\theta - \alpha + \pi/4| - \pi/4) \qquad (3)$$

where C is a constant dependent on the relationship between the astigmatism and the stigmeter currents, $\theta$ the angle at which the astigmatism occurs, and $\alpha$ is an angle relating to the magnification M. Consequently, it is possible to determine precisely the stigmeter currents required for properly correcting the astigmatism when the extent of astigmatism δz is quantitatively found. The above process of astigmatism correction is described in detail in, for example, "JOURNEY TO GENE OBSERVATION" edited by Hideo Yamagishi and published by The University of Tokyo, Publishing Society.

In order to produce the optically converted figure through the Fourier transform, it is necessary to expose a photographic film to the electron microscope image of an amorphous material, develop the image on the photograhic film, set the developed photographic image in a Fourier transform optical device, expose a photographic film to the optically converted figure, and finally develop the optically converted figure on the film. Such a procedure is quite complex. It is also necessary to measure the lengths s and l of the minor and major axes from the optically converted figure. As a consequence, the work of correcting astigmatism is laborious and time-consuming.

SUMMARY OF THE INVENTION

In view of the aforesaid drawbacks of the conventional focusing practices, it is an object of the present invention to provide a method of detecting a focus defect such as a defocused condition or astigmatism of an electron microscope image simply, quickly, precisely, and easily even when conducted by an unskilled ooerator.

According to the present invention, there is provided a method of detecting a defocus of an image produced by an electron microscope, comprising the steps of exposing a two-dimensional image sensor under vacuum to an electron beam having passed through a specimen to enable the two-dimensional image sensor to store the energy of the electron beam, applying stimulating energy to the two-dimensional image sensor to discharge the stored energy as light, photoelectrically detecting the light discharged from the two-dimensional image sensor to produce an image signal, and computing the defocus of the image based on the image signal.

The defocus can be computed from the image signal by the following equation:

$$\Delta f = \pm (\delta_F^2/\lambda) \qquad (4)$$

which is derived from the equation expressing the width $\delta_F$ of Fresnel diffraction:

$$\delta_F = \sqrt{\Delta f \times \lambda}$$

where
Δf: the defocus; and
λ: the wavelength of the electron beam.

Where the electron microscope image is to be focused on the Scherzer focus of the objective lens, the Scherzer focus of the electron microscope is determined in advance from the equation:

$$Z_0 = 1.19 (Cs \lambda)^{1/2} \qquad (5)$$

where
Cs: the spherical aberration coefficient of the objective lens; and
λ: the wavelength of the electron beam.

Then, a thin layer of an amorphous materials such as carbon, silicon, or the like is coated on the specimen through vacuum deposition to a thickness which will not obstruct image observation, and the image signal of the electron microscope image is subject to the Fourier transform to determine the radius r of a ring pattern produced by the amorphous material. The defocus Z is determined by the following equation:

$$Z = n/\lambda M^2 r^2 + Cs \, \lambda^2 M^2 r^2/2 \qquad (6)$$

followed by computation of a defocus Δf′=Z−Zo from the Scherzer focus.

Every electron microscope exhibits its own peculiar commensurate relationship between the focal length of the objective lens and the electric field produced thereby. By ascertaining this relationship between the focal length and the electric field of the objective lens, and selecting the electric field of the objective lens in accordance with the defocus Δf or Δf′ determined as above, the focal length of the objective lens can be determined so as to eliminate the defocus Δf or Δf′, thus bringing the electron microscope image into focus. The image can automatically be focused to eliminate the defocus Δf or Δf′ by controlling a means for adjusting the electric field of the objective lens with a control signal based on the defocus Δf or Δf′.

The radius r of the ring pattern can be determined as by integrating the image density in the circumferential direction of the ring pattern to obtain a density distribution histogram in a radial direction and regarding the minimum point of the histogram as the point spaced the distance r from the center of the ring pattern.

Since an electron microscope image is recorded on a two-dimensional image sensor such as a stimulable phosphor sheet, the electron microscope image can be recorded with high sensitivity, and hence the amount of the electron beam produced in the electron microscope can be reduced to lessen damage to the specimen.

The defocus is determined on the basis of the image signal read out from the two-dimensional image sensor. Therefore, the defocus can be detected accurately in a short period of time, and the image can be focused quickly and simply.

According to the present invention there is also provided a method of correcting astigmatism of an image produced by an electron microscope with a stigmeter, comprising the steps of exposing a two-dimensional image sensor under vacuum to an electron beam having passed through an amorphous material to enable the two-dimensional image sensor to store the energy of the electron beam, applying stimulating energy to the two-dimensional image sensor to discharge the stored energy as light, photoelectricaly detecting the light discharged from the two-dimensional image sensor to produce an image signal, electrically performing the Fourier transform on the discharged light to produce a converted image signal bearing a ring pattern, computing the degree of one ring of the ring pattern, the lengths of minor and major axes of the one ring, and the angle of inclination of the major axis, based on the converted image signal, and computing currents to be passed through the stigmeter based on the computed degree, lengths, and angle of inclination.

The currents to be fed to the stigmeter can be computed according to the aforesaid equations (1), (2), and (3).

The two-dimensional image sensor comprises a stimulable phosphor sheet as disclosed in U.S. Pat. Nos.

4,258,264; 4,276,473; 4,315,318; 4,387,428, and Japanese Unexamined Patent Publication No. 56(1981)-11395, for example. Certain phosphors, when exposed to a radiation such as an electron beam, store a part of the energy of the radiation. When the phosphor exposed to the radiation is exposed to stimulating rays such as visible light, the phosphor emits light (stimulated emission) in proportion to the stored energy of the radiation. Such a phosphor is called a stimulable phosphor.

The two-dimensional image sensor may also be in the form of a thermoluminescent phosphor sheet as disclosed in Japanese Patent Publication Nos. 55(1980)-47719 and 55(1980)-47720, for example. The thermoluminescent phosphor sheet emits stored radiation energy as thermoluminescence when heat is applied to the sheet. The two-dimensional image sensor is generally composed of a support and a phosphor layer disposed on the support. The stimulable phosphor layer may be formed by dispersing the stimulable phosphor in a suitable binder. However, the stimulable phosphor layer may itself be a stimulable phosphor sheet if it is self-supporting.

The two-dimensional image sensor is placed on the image formation plane of the electron microscope, and the electron microscope image is recorded on the two-dimensional sensor by the electron beam transmitted through the specimen. Then, the two-dimensional sensor on which the electron microscope image is stored is scanned by stimulating rays such as visible light or heat to enable the image sensor to emit the stored electron beam energy as light. The emitted light is then photoelectrically read to produce an electric signal indicative of the transmitted electron-beam image.

The stimulable phosphor employed in the stimulable phosphor sheet according to the present invention may comprise phosphors expressed by the composition formulas: $SrS:Ce, Sm$; $SrS:Eu, Sm$; $ThO_2:Er$; and $La_2O_2S:Eu, Sm$, as disclosed in U.S. Pat. No. 3,859,527.

The stimulable phosphor may also comprise phosphors expressed by the composition formulas: $ZnS:Cu,Pb$; $BaO.xAl_2O_3:Eu$ [where $0.8 \leq X \leq 10$]; and $M^{II}O.xSiO_2:A$ [where $M^{II}$ is Mg, Ca, Sr, Zn, Cd, or Ba; A is Ce, Tb, Eu, Tm, Pb, Tl, Bi, or Mn; and $0.5 \leq X \leq 2.5$], as disclosed in U.S. Pat. No. 4,236,078.

The stimulable phosphor may also comprise phosphors expressed by the composition formula: $(Ba_{l-x-y}Mg_x Ca_y)FX:aEu^{2+}$ [where X is at least one of Cl and Br; $0 < x+y \leq 0.6$, $xy \neq 0$, and $10^{-6} \leq a \leq 5 \times 10^{-2}$], as disclosed in Japanese Unexamined Patent Publication No. 55(1980)-12143.

The stimulable phosphor may also comprise phosphors expressed by the composition formula: $LnOX:xA$ [where Ln is at least one of La, Y, Gd, and Lu; X is at least one of Cl and Br; A is at least one of Ce and Tb; and $0 < x < 0.1$], as disclosed in U.S. Pat. No. 4,236,078.

The stimulable phosphor may also comprise phosphors expressed by the composition formula: $(Ba_{l-x}M^{II}_x)FX:yA$ [where $M^{II}$ is at least one of Mg, Ca, Sr, Zn, and Cd, X is at least one of Cl, Br, and I; A is at least one of Eu, Tb, Ce, Tm, Dy, Pr, Ho, Nd, Yb, and Er; $0 \leq x \leq 0.6$, and $0 \leq y \leq 0.2$], as disclosed in U.S. Pat. No. 4,239,968.

The stimulable phosphor may also comprise phosphors expressed by the composition formula: $M^{II}FX.xA:yLn$ [where $M^{II}$ is at least one of Ba, Ca, Sr, Mg, Zn, and Cd; A is at least one of BeO, MgO, CaO, SrO, BaO, ZnO, $Al_2O_3$, $Y_2O_3$, $La_2O_3$, $In_2O_3$, $SiO_2$, $TiO_2$, $ZrO_2$, $GeO_2$, $SnO_2$, $Nb_2O_5$, $Ta_2O_5$, and $ThO_2$; Ln is at least one of Eu, Tb, Ce, Tm, Dy, Pr, Ho, Nd, Yb, Er, Sm, and Gd; X is at least one of Cl, Br, and I; $5 \times 10^{-5} < x < 0.5$, and $0 < y < 0.2$], as disclosed in Japanese Unexamined Patent Publication No. 55(1980)-160078 (U.S. patent application Ser. No. 591,224).

The stimulable phosphor may also comprise phosphors expressed by the composition formula: $(Ba_{l-x}M^{II}_x)F_2.aBaX_2:yEu^{2+}, zA$ [where $M^{II}$ is at least one of beryllium, magnesium, calcium, strontium, zinc, and cadmium; X is at least one of chlorine, bromine, and iodine; A is at least one of zirconium and scandium; $0.5 \leq a \leq 1.25$, $0 \leq x \leq 1$, $10^{-6} \leq y \leq 2 \times 10^{-1}$, and $0 < z \leq 10^{-2}$], as disclosed in Japanese Unexamined Patent Publication No. 56(1981)-116777.

The stimulable phosphor may also comprise phosphors expressed by the composition formula: $(Ba_{l-x}M^{II}_x)F_2.aBaX_2:yEu^{2+}, zB$ [where $M^{II}$ is at least one of beryllium, magnesium, calcium, strontium, zinc, and cadmium; X is at least one of chlorine, bromine and iodine; $0.5 \leq a \leq 1.25$, $0 \leq x \leq 1$, $10^{-6} \leq y \leq 2 \times 10^{-1}$, and $0 < z \leq 10^{-1}$], as disclosed in U.S. Pat. No. 4,336,154.

The stimulable phosphor may also comprise phosphors expressed by the composition formula: $(Ba_{l-x}M^{II}_x)F_2.aBaX_2:yEu^{2+}, zA$ [where $M^{II}$ is at least one of beryllium, magnesium, calcium, strontium, zinc, and cadmium; X is at least one of chlorine, bromine, and iodine; A is at least one of arsenic and silicon; $0.5 \leq a \leq 1.25$, $0 \leq x \leq 1$, $10^{-6} \leq y \leq 2 \times 10^{-1}$, and $0 < z \leq 5 \times 10^{-1}$], as disclosed in Japanese Unexamined Patent Publication No. 57(1982)-23675.

The stimulable phosphor may also comprise phosphors expressed by the composition formula: $(Ba_{l-x}M_{x/2} L_{x/2})FX:yEu^{2+}$ [where M is at least one alkaline metal selected from the group consisting of Li, Na, K, Rb, and Cs; L is at least one trihydric metal selected from the group consisting of Sc, Y, La, Ce, Pr, Nd, Pm, Sm, Gd, Tb, Dy, Ho, Er, Tm, Yb, Lu, Al, Ga, In, and Tl; X is at least one halogen selected from the group consisting of Cl, Br, and I; $10^{-2} \leq x \leq 0.5$, and $0 < y \leq 0.1$], as disclosed in Japanese Unexamined Patent Publication No. 58(1983)-206678 (U.S. patent application Ser. No. 741,020).

The stimulable phosphor may also comprise phosphors expressed by the composition formula: $BaFX.xA:yEu^{2+}$ [where X is at least one halogen selected from the group consisting of Cl, Br, and I; A is a calcined tetrafluoroboric compound; $10^{-6} \leq x \leq 0.1$, and $0 < y \leq 0.1$], as disclosed in Japanese Unexamined Patent Publication No. 59(1984)-27980.

The stimulable phosphor may also comprise phosphors expressed by the composition formula: $BaFX.xA:yEu^{2+}$ [where X is at least one halogen selected from the group consisting of Cl, Br, and I; A is at least one calcined compound selected from the group consisting of the salts of monohydric or dihydric metals of hexafluorosilicic acid, hexafluorotitanic acid, and hexafluorozirconic acid; $10^{-6} \leq x \leq 0.1$, and $0 < y \leq 0.1$], as disclosed in Japanese Unexamined Patent Publication No. 59(1984)-47289.

The stimulable phosphor may also comprise phosphors expressed by the composition formula: $BaFX.xNaX':aEu^{2+}$ [where each of X and X' is at least one of Cl, Br, and I; $0 < x \leq 2$, and $0 < a \leq 0.2$], as disclosed in Japanese Unexamined Patent Publication No. 59(1984)-56479.

The stimulable phosphor may also comprise phosphors expressed by the composition formula: $M^{II}FX.x$-

NaX': yEu$^{2+}$, zA [where M$^{II}$ is at least one alkaline earth metal selected from the group consisting of Ba, Sr, and Ca; each of X and X' is at least one halogen selected from the group consisting of Cl, Br, and I; A is at least one transition metal selected from the group consisting of V, Cr, Mn, Fe, Co, and Ni; $0 < x \leq 2, 0 < y \leq 0.2$, and $0 < z \leq 10^{-2}$], as disclosed in U.S. Pat. No. 4,505,989.

The stimulable phosphor may also comprise phosphors expressed by the composition formula: M$^{II}$FX·aM$^{I}$X'· bM$'^{II}$X''$_2$·cM$^{III}$X'''$_3$·xA:yEu$^{2+}$ [where M$^{II}$ is at least one alkaline earth metal selected from the group consisting of Ba, Sr, and Ca; M$^{I}$ is at least one alkaline metal selected from the group consisting of Li, Na, K, Rb, and Cs; M$'^{II}$ is at least one dihydric metal selected from the group consisting of Be and Mg; M$^{III}$ is at least one trihydric metal selected from the group consisting of Al, Ga, In, and Tl; A is a metal oxide; X is at least one halogen selected from the group consisting of Cl, Br, and I; X', X'', and X''' are at least one halogen selected from the group consisting of F, Cl, Br, and I; $0 \leq a \leq 2$, $0 \leq b \leq 10^{-2}, 0 \leq c \leq 10^{-2}$, and $a+b+c \geq 10^{-6}$; $0 < x \leq 0.5$ and $0 < y \leq 0.2$], as disclosed in Japanese Unexamined Patent Publication No. 59(1984)-75200 filed by the present applicant.

The stimulable phosphor may also comprise phosphors expressed by the composition formula: M$^{II}$X$_2$·aM$^{II}$X'$_2$:aEu$^{2+}$ [where M$^{II}$ is at least one alkaline earth metal selected from the group consisting of Ba, Sr, and Ca; X and X' are at least one halogen selected from the group consisting of Cl, Br, and I with X $\neq$ X'; $0.1 \leq a \leq 10.0$ and $0 < x \leq 0.1$], as disclosed in Japanese Patent Publication No. 59(1983)-193161 (U.S. patent application Ser. No. 834,486).

The stimulable phosphor which can be employed in the present invention is however not limited to the aforesaid phosphors, but may be any phosphor capable of stimulated emission upon exposure to stimulating light after it has been irradiated with a radiation such as an electron beam.

Preferred thermoluminescent phosphors that can be used in the present invention include compounds produced by adding a small amount of at least one of Mn, Dy, and Tm to sulphuric compounds such as Na$_2$SO$_4$, MnSO$_4$, CaSO$_4$, SrSO$_4$, and BaSO$_4$.

The phosphor sheet may additionally have a protective layer and a light-reflecting or light-absorbing undercoated layer. The phosphor layer of the phosphor sheet may be colored with a pigment or a dye as disclosed in U.S. Pat. No. 4,394,581.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 5 is a vertical cross-sectional view of a device for carrying out a method according to a fourth embodiment of the present invention; and FIG. 6 is a view for explaining of the method which can be effected by the device shown in FIG. 5.

DESCRIPTION OF THE PREFERRED EMBODIMENTS

Figure 1:
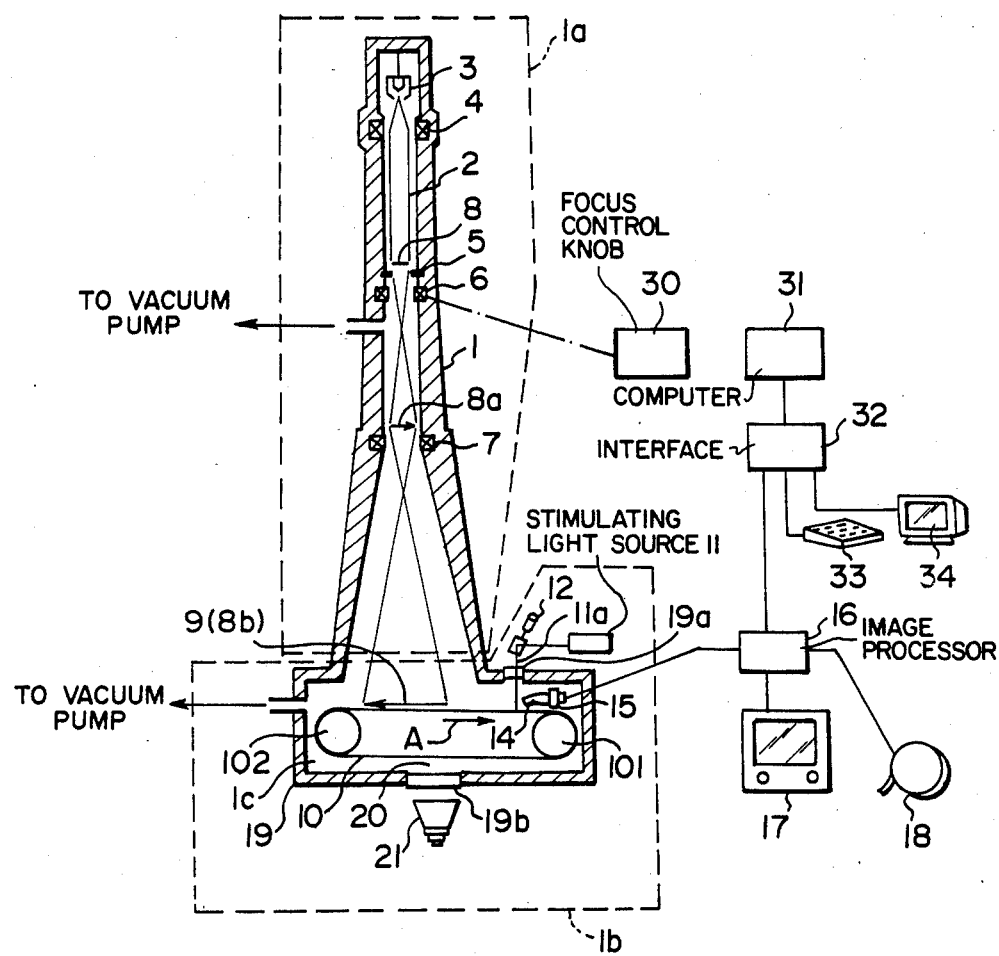
FIG. 1 is a vertical cross-sectional view of a device for carrying out a method according to a first embodiment of the present invention.

Like or corresponding parts are denoted by like or corresponding reference characters throughout several views.

FIG. 1 shows a device for recording and reproducing electron microscope images, the device being employed to perform a method according to a first embodiment of the present invention. The device includes an electron microscope 1a having a tubular lens barrel 1 and a recorder/reader assembly 1b composed of a stimulable phosphor sheet 10 serving as a two-dimensional image sensor, a stimulating means for scanning the stimulable phosphor sheet 10 with stimulating light while the stimulable phosphor sheet 10 is placed under vacuum, and a detector means for photoelectrically detecting light emitted by the stimulable phosphor sheet 10. The stimulable phosphor sheet 10 and the image formation plane 9 of the electron microscope 1a are positioned in a vacuum chamber 1c at least when the stimulable phosphor sheet 10 is exposed to an electron beam for recording an image thereon. The interior of the lens barrel 1 and the interior of the vacuum chamber 1c are kept under vacuum by a known means such as a vacuum pump while the electron microscope 1a is in operation.

The lens barrel 1 houses an electron gun 3 for emitting an electron beam 2 at a uniform speed, at least one condenser lens 4 comprising a magnetic lens or an electrostatic lens for converging the electron beam 2 toward a specimen 8, a specimen support 5, an objective lens 6 identical to the condenser lens 4, and a projector lens 7. The electron beam 2 having passed through the specimen 8 placed on the specimen support 5 is deflected by the objective lens 6 to form a magnified transmission image 8a of the specimen 8. The magnified transmission image 8a is focused by the projector lens 7 as an image 8b on the image formation plane 9.

The stimulable phosphor sheet 10 in the recorder/reader 1b is in the form of an endless belt trained around a cylindrical driver roller 101 and a cylindrical driven roller 102 spaced horizontally from each other. The stimulating means has a stimulating light source 11 comprising an He—Ne laser or a semiconductor laser for emitting a stimulating light beam 11a and a light deflector 12 such as a galvanometer mirror for deflecting the stimulating light beam 11a transversely across the sheet 10 to scan the same. The vacuum chamber 1c is defined by a casing 19 communicating with the lens barrel 1 and having a light-transmissive wall member 19a made as of lead glass and through which the stimulating light beam 11a passes from the light deflector 12 toward the sheet 10. The detector means includes a light guide 14 for collecting light emitted from the sheet 10, and a photoelectric transducer 15 such as a photomultiplier coupled to the exit end of the light guide 14 for detecting the emitted light through a filter which removes the stimulating light and producing a orresponding electric signal. The stimulable phosphor sheet 10 is composed of a flexible endless-belt support and a stimulable phosphor layer deposited on the outer surface of the endless-belt support. The endless-belt stimulable phosphor sheet 10 is driven to run in the direction of the arrow A when the driver roller 101 is rotated by a drive unit such as a motor.

The endless-belt stimulable phosphor sheet 10, the driver roller 101, the driven roller 102, the light guide 14, and the photoelectric transducer 15 are disposed in the vacuum chamber 1c. However, the exit end of the light guide 14 may project out of the casing 19 so that the photoelectric transducer 15 may be disposed outside of the vacuum chamber 1c.

In operation, a shutter (not shown) positioned between the electron microscope 1a and the recorder/reader assembly 1b is opened to expose the portion of the stimulable phosphor sheet 10 located in the image formation plane 9 to an electron beam which bears the magnified transmission image 8b of the specimen 8 for thereby storing the electron beam energy on the sheet 10. Then, the driver roller 101 is rotated to move the exposed portion of the sheet 10 toward a read-out section. The exposed portion of the sheet 10 is scanned transversely (main scanning) by the stimulating light beam 11a deflected by the light deflector 12 and transmitted through the light-transmissive wall member 19a, while at the same time the sheet 10 is continuously moved in the direction of the arrow A so that the sheet 10 is scanned longitudinally (sub-scanning). Therefore, the stimulable phosphor sheet 10 is two-dimensionally scanned by the stimulating light beam 11a. Light which is emitted from the sheet 10 upon exposure to the stimulating light beam 11a and which is commensurate with the level of the stored electron beam energy, enters the light guide 14 through its light input end and travels therethrough while being subject to total reflection therein. The light is then detected by the photoelectric transducer 15 which photoelectrically converts the amount of light into an electric signal.

The electric signal generated by the photoelectric transducer 15 is processed by an image signal processor 16, and the processed image signal is applied through an interface 32 to a computer 31. The transmission image 8b produced by the computer 31 based on the image signal is displayed on a CRT 34. The electron microscope operator then observes the displayed image to find an area where Fresnel diffraction is produced in the image, and identifies the area with the cursor on the CRT 34 through a keyboard 33. The computer 31 determines the width $\delta_F$ of the identified Fresnel diffraction, and computes a defocus $\Delta f$ according to the aforesaid equation (4):

$$\Delta f = \pm (\delta_F{}^2/\lambda)$$

From the given electric field and focal length of the objective lens 6, the computer 31 determines a corrective electric field to eliminate the defocus $\Delta f$, and displays on the CRT 34 the extent to which a focus control knob 30 has to be turned to achieve the corrective electric field. The operator then turns the focus control knob 30 by the displayed amount to focus the magnified transmission image 8b. The focus control knob 30 serves to vary the electric field of the objective lens 6 to change its focal length in the well-known manner.

After the magnified transmission image 8b has been focused sharply, the image 8b is recorded on the sheet 10 again to produce a final output image thereon. Since the sheet 10 has traveled to allow the focusing image to be read out, the image 8b is recorded as the final output image on a new area of the sheet 10 which has arrived at the image formation plane 9. The magnified transmission image 8b newly recorded on the sheet 10 is read out in the same manner as described above, and reproduced on a CRT display 17 or in an image reproducer such as a recorder in which the image is optically scanned and recorded on a photosensitive film. The reproduced magnified transmission image 8b is sharply focused since it has gone through the aforesaid focusing process. The reproduced image is therefore utilized as the final output image for observation of the specimen 8. Instead of, or in addition to, reproducing the final output image on the CRT display 17 for immediate observation, the electric signal indicating the final output image may be stored in a recording medium 18 such as a magnetic tape, or the final output image may be optically recorded on a photosensitive film.

Figure 4:
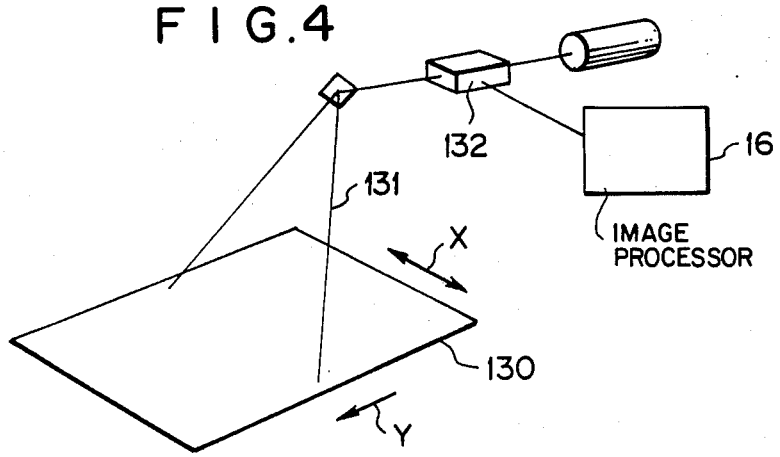
FIG. 4 is a perspective view of an image reproducer for reproducing an electron microscope image according to the method of the present invention.

FIG. 4 shows an image scanning recorder which can be used as the image reproducer. A photosensitive film 130 is scanned transversely in the direction of the arrow X (main scanning) by a laser beam 131 while at the same time the photosensitive film 130 is moved in the direction of the arrow Y (subscanning). At this time, the laser beam 131 is modulated by an acoustooptic modulator 132 based on the image signal supplied from the image processor 16 for thereby forming a visible image on the photosensitive film 130.

The size of the visible image reproduced on the photosensitive film 130 is selected to be larger than the size of the image formation plane 9 (i.e., the area in which the radiation image energy is recorded on the sheet 10). Therefore, the magnified transmission image 8b is reproduced on the photosensitive film 130 at a scale greater than that on the image formation plane 9. The image reproduced at the enlarged scale on the photosensitive film 130 is of sufficiently good quality since the magnified transmission image 8b can be defined with high sharpness by using the stimulable phosphor sheet 10. As a consequence, the stimulable phosphor sheet 10 may be of a relatively small size, and the photoelectric transducer 15 may also be small in size, with the result that the overall device may be small in size.

For producing a magnified image from the image scanning recorder shown in FIG. 4, the density of scanning lines employed in the image scanning recorder should be coarser than the density of scanning lines used in reading image information from the stimulable phosphor sheet 10. More specifically, it is preferable to set the scanning line density to 10 pixels/mm or more, particularly to between 15 pixels/mm and 100 pixels/mm for, reading sufficiently image information from the stimulable phosphor sheet 10 of a relatively small size. For reproducing a magnified image without degrading its quality, the scanning line density for recording the image is selected to be coarser than the above scanning line density and preferably in the range from 5 pixels/mm to 20 pixels/mm.

After the image has been read from the sheet 10, the image-recording portion thereof (including the portion exposed to the electron beam 2 for focusing purposes) is fed to an erasing zone 20 where erasing light emitted from an erasing light source 21 such as a fluorescent lamp disposed outside of the casing 19 is radiated onto the sheet 10 through a light-transmissive wall member 19b supported on the casing 19. The erasing light is in the same wavelength region as that of the stimulating light for the stimulable phosphor sheet 10. Therefore, upon exposure to the erasing light from the erasing light source 21, any remanent image stored in the phosphor layer of the sheet 10 and noise arising from a radioactive element such as $^{226}$Ra contained as an impurity in the phosphor layer can be discharged from the sheet 10. The erasing light source 21 may comprise a tungsten lamp, a halogen lamp, an infrared lamp, a xenon flash lamp, or a laser source, as disclosed in U.S. Pat. No. 4,400,619.

Figure 2:
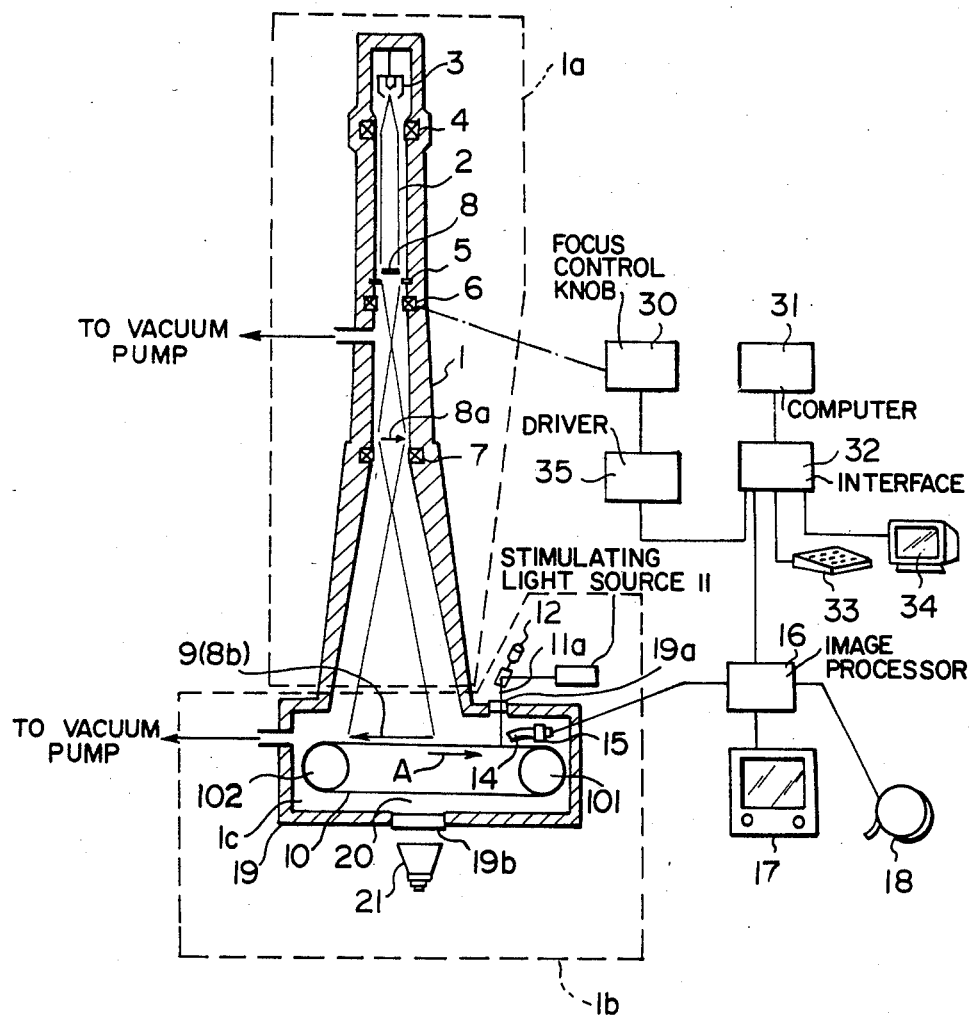
FIG. 2 is a vertical cross-sectional view of a device for carrying out a method according to a second embodiment of the present invention.

In the aforesaid embodiment, the actual focusing process is performed by the electron microscope operator. FIG. 2 illustrates a device for carrying out a method of automatically focusing an electron microscope image according to a second embodiment of the present invention. In the device of FIG. 2, the computer 31 effects the calculation according to the aforesaid equation (6):

$$Z = n/\lambda M^2 r^2 + Cs\, \lambda^2 M^2 r^2 / 2$$

based on the image signal supplied from the image processor 16 through the interface 32, and then determines the difference between the above defocus Z and a given Scherzer focus Zo expressed by the equation (5):

$$Zo = 1.19\, (Cs\, \lambda)^{1/2}$$

that is, the deviation of the defocus from the Scherzer focus $\Delta f' = Z - Zo$. Then, the computer 31 determines the corrective electric field of the objective lens 6 required to eliminate the defocus $\Delta f'$, and applies a correction signal representative of the corrective electric field to a driver 35. The driver 35 responds to the applied correction signal to turn the focus control knob 30 for thereby enabling the objective lens 6 to produce the electric field for eliminating the defocus $\Delta f'$. Thus, the magnified transmission image 8b is sharply focused on the Scherzer focus of the objective lens 6. The spherical aberration coefficient Cs of the objective lens 6 should be ascertained from the specifications of the electron microscope 1a or be actually measured. The radius r of the ring pattern can be determined in the manner described above, and the degree n of the ring can be known by ascertaining which one of a plurality of minimum points is the minimum point of the density distribution histogram indicating the ring pattern radius r. Since the defocus $\Delta f'$ is determined only through the arithmetic operation, it is not necessary to display the magnified transmission image 8b on the CRT 34 for focusing purposes.

Rather than the endless-belt stimulable phosphor sheet 10, a single stimulable phosphor sheet may be employed which is reciprocally moved between the recording and reading zones in the recorder/reader assembly 1b for alternately recording and reading images. One or more such stimulable phosphor sheets may be fixed to a feed means such as an endless belt which is driven to use the stimulable phosphor sheet or sheets in repetitive cycles.

The image produced for focusing purposes need not be the same size as that of the final output image, but may be obtained as a portion of the image by radiating stimulating light onto and detecting light emitted from only part of the entire image frame. This shortens the time required for reproducing the focusing image, and hence the focusing process can be effected more efficiently. As an alternative way of attaining greater efficiency, a focusing image may be read as larger pixels than those of the final output image.

The image produced for display on the CRT display 34 can be utilized not only for computing the defocus $\Delta f$, but also for determining the field of the final output image. A shutter may be disposed between the specimen 8 and the electron gun 3 for cutting off the electron beam 2 when the sheet 10 is not exposed to the electron beam 2, so that the specimen 8 will be less subject to damage due to bombardment by the electron beam 2.

Figure 3:
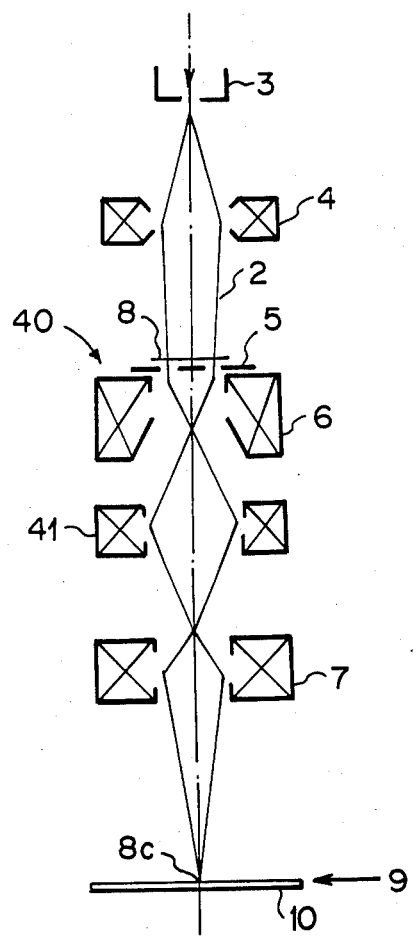
FIG. 3 is a schematic view of an electron microscope which can be employed to effect a method according to a third embodiment of the present invention.

The principles of the present invention can be employed for recording and reproducing the diffraction pattern of a specimen. FIG. 3 is explanatory of a method according to a third embodiment for recording and reproducing such a diffraction pattern 8c of the specimen 8. The electron microscope, generally denoted at 40, has an intermediate lens 41 disposed between the objective lens 6 and the projector lens 7. The diffraction pattern 8c of the specimen 8, which is formed on the rear focal plane of the objective lens 6, is magnified by the intermediate lens 41 and the projector lens 7 with their focal points on the rear focal plane of the objective lens 6 and is projected onto the image formation plane 9. By placing the stimulable phosphor sheet 10 in the image formation plane 9, the magnified image of the diffraction pattern 8c can be recorded by the electron beam 2 on the stimulable phosphor sheet 10. The recorded diffraction pattern 8c can be read in the same manner as described with reference to FIGS. 1 and 2, and the defocus $\Delta f$ or $\Delta f'$ can be computed on the basis of the image signal read out.

The recorded pattern or recorded information is determined by the recorded condition of a transmitted electron-beam image (magnified transmission image or magnified diffraction pattern) recorded on the stimulable phosphor sheet 10, the nature of the specimen 8, and the manner of recording the image. For eliminating any adverse effect arising from variation in recording conditions or for obtaining an electron microscope image which can clearly be observed at the time of displaying the image on the CRT for observing Fresnel diffraction, such recorded information should be ascertained prior to the reproduction of a visible image by which the specimen can be observed. The read-out gain should be adjusted or the image-dependent signal should be processed on the basis of the ascertained recorded information. Furthermore, the generation of a reproduced image which can effectively be observed requires that a recording scale factor be determined in order to optimize the resolution of the reproduced image dependent on the contrast of the recorded pattern.

One way of ascertaining the recorded information on the sheet 10 before a visible image is produced for observing the specimen 8 is disclosed in Japanese Unexamined Patent Publication No. 58(1983)-89245. More specifically, prior to the generation of a visible image for observing the specimen 8 (final reading mode), the recorded information stored in the stimulable phosphor sheet 10 is read (preliminary reading mode) with stimulating light having a lower level of energy than that of stimulating light to be applied in the final reading mode. Based on the recorded information thus ascertained, the read-out gain is suitably adjusted or a recording scale factor is determined for the final reading mode, or the signal generated in the final reading mode is appropriately processed.

The photoelectric read-out means for photoelectrically reading light emitted from the stimulable phosphor sheet 10 may comprise a solid-state photoelectric transducer rather than the photomultiplier (see Japanese Patent Application Nos. 58(1983)-86226, 58(1983)-86227, 58(1983)-219313, and 58(1983)-219314, and Japanese Unexamined Patent Publication No. 58(1983)-121874). A plurality of solid-state photoelectric transducer elements may be disposed in covering relation to the entire surface of the stimulable phosphor sheet 10, or may be integral with the sheet 10, or may be located closely to the sheet 10. The photoelectric read-out means may also employ a line sensor composed of an array of solid-state photoelectric transducer elements, or a single solid-state photoelectric transducer element corresponding to one pixel and movable to scan the entire surface of the sheet 10.

The source of stimulating light may employ an array of light-emitting diodes or semiconductor lasers for preventing loss of light emitted from the sheet 10 and for allowing the read-out means to detect emitted light at a larger angle for an increased S/N ratio. The electric signal generated by the read-out means can be read out at a high speed since the signal is rendered time-dependent by electric processing in the read-out means, not by time-dependent application of the stimulating light.

The stimulable phosphor sheet may be a thermofluorescent phosphor sheet. For discharging the stored energy from the thermofluorescent phosphor sheet, the sheet may be scanned by thermal radiation emitted from a heat source such as a $CO_2$ laser source. For more details, reference should be made to Japanese Patent Publication No. 55(1980)-47720.

After the image has been focused sharply according to the foregoing methods of the invention, the final output image may be recorded on an ordinary photographic film. By recording the final output image on a two-dimensional image sensor such as the stimulable phosphor sheet, however, the amount of the electron beam applied to the specimen 8 when recording the final output image can be reduced, and the reproduced final output image is better in quality than images reproduced on photographic films.

After the image has been recorded on the stimulable phosphor sheet 10, the vacuum chamber 1c may be devacuumized, then the sheet 10 may be taken out of the vacuum chamber, and finally the image stored therein may be read by an image reader separate from the electron microscope. However, where the stimulable phosphor sheet is recyclically used in the vacuum chamber, the focusing process can efficiently be performed without replacing the sheet or breaking the vacuum condition in the vacuum chamber.

With the arrangement of the present invention, an electron microscope image of a specimen is recorded with a high degree of sensitivity on a two-dimensional image sensor such as a stimulable phosphor sheet. Therefore, the amount of an electron beam emitted in the electron microscope can be lowered to reduce damage to the specimen which is caused by exposure to the electron beam when detecting a defocus of an electron microscope image.

Since the electron microscope image for detecting the defocus is read as an electric signal and the defocus is detected by an arithmetic operation on the electric signal, the defocus can simply, accurately, quickly, and easily be measured even by an unskilled operator.

FIG. 5 shows a device for carrying out a method according to a fourth embodiment of the present invention. The device includes an electron microscope 1a virtually identical in construction to the electron microscope 1a shown in FIGS. 1 and 2.

An apparatus 50 for recording and reading electron microscope images is disposed below the lens barrel 1. The apparatus 50 comprises a two-dimensional image sensor 51 such as a stimulable phosphor sheet fixed in the image formation plane 9 in the lens barrel 1, a stimulating means composed of a stimulating light source 52 and an optical scanning system 53 for scanning the stimulable phosphor sheet 51, a photoelectric transducer 55 such as a photomultiplier positioned in confronting relation to the stimulable phosphor sheet 51 through a light-transmissive window 54 in a peripheral wall of the lens barrel 1, and an erasing light source 56.

The stimulable phosphor sheet 51 comprises a stimulable phosphor layer deposited on a transparent support. The stimulating light source 52 comprises an He—Ne laser or a semiconductor laser for emitting a stimulating laser beam 52a. The optical scanning system 53 includes a first light deflector 53a, a second light deflector 53b, and a fixed mirror 53c. Each of the first and second light deflectors 53a, 53b may be a known light deflector such as a galvanometer mirror, a polygonal mirror, a hologram scanner, or an acoustooptic deflector. The stimulating laser beam 52a emitted from the stimulating light source 52 is deflected by the first light deflector 53a in a first direction, and then deflected by the second light deflector 53b in a direction normal to the first direction as indicated by the arrow A. The deflected light beam 52a is passed through a sheet of lead glass fitted in a light-transmissive window 61 defined in the wall of the lens barrel 1, and then reflected by the fixed mirror 53c to impinge upon the stimulable phosphor sheet 51. The stimulable phosphor sheet 51 is therefore two-dimensionally scanned in X and Y directions by the laser beam 52a. The laser beam 52a is preferably passed through a filter (not shown) for cutting off the wavelength region of light emitted from the stimulable phosphor sheet 51, then adjusted in beam diameter by a beam expander (not shown) before being deflected by the light deflectors 53a, 53b, and finally passed through an fθ lens (not shown) for adjustment into a uniform beam diameter prior to application to the stimulable phosphor sheet 51.

The erasing light source 56 emits light 56a in the same wavelength region as that of stimulating light to be applied to the stimulable phosphor sheet 51. A mirror 57 is positioned for angular movement between a first position in the path of the laser beam 52a between the second light deflector 53b and the fixed mirror 53c and a second position out of the path of the laser beam 52a. When the mirror 57 is in the first position, erasing light 56a emitted from the erasing light source 56 is gathered by a lens 58 and reflected by the mirrors 57, 53c to fall on the stimulable phosphor sheet 51 over its entire surface.

A shutter 59 for shutting off the electron beam 2 is angularly movably positioned between the stimulable phosphor sheet 51 and the lens barrel 1. A sheet 60 of glass fitted in the window 54 has an optical filter for allowing light emitted from the stimulable phosphor sheet 51 to pass therethrough while cutting off the stimulating light beam 52a. A light shutter 64 is disposed between the glass sheet 60 and the photomultiplier 55. The interior of the lens barrel 1 including the portion accommodating the stimulable phosphor sheet 51 is kept under vacuum by a vacuum pump (not shown) while the electron microscope is in operation.

Operation of the apparatus 50 for recording and reproducing an electron microscope image will be described below. When the shutter 59 is opened as illustrated, the stimulable phosphor sheet 51 disposed in the image formation plane 9 is exposed to the electron beam 2 to store the energy of the electron beam 2 which carries the magnified transmission image 8b of the specimen 8. The light shutter 64 should preferably be closed while the stimulable phosphor sheet 51 is exposed to the electron beam 2. Then, the shutter 59 is closed and the light shutter 64 is opened. The stimulating light source 52 is energized to emit the stimulating light beam 52a which is deflected in the X and Y directions to scan the stimulable phosphor sheet 51 two-dimensionally. The stimulable phosphor sheet 51 now emits light in an intensity commensurate with the energy level of the electron beam 2 which has been applied to the sheet 51. The light thus emitted from the sheet 51 is photoelectrically detected by the photomultiplier 55 through the glass sheet 60, while at the same time the optical filter therein removes the stimulating light beam 52a.

In response to detection of the light emitted from the stimulable phosphor sheet 51, the photomultiplier 55 generates an electric signal S which is processed by an image signal processor 22, and the processed signal is fed to an image reproducer 23 such as a CRT display or an image recording apparatus which optically scans a photosensitive film to record the image thereon. Therefore, the magnified transmission image 8b borne by the stimulated emission from the stimulable phosphor sheet 51 can be reproduced by employing the electric signal S commensurate with the amount of the light emitted from the stimulable phosphor sheet 51.

While the optical filter in the glass sheet 60, the light shutter 64, and the photomultiplier 55 are shown as being disposed outside of the vacuum system in the lens barrel 1, arranged in the order named away from the scanned side of the stimulable phosphor sheet 51, they may be disposed in the vacuum system in close contact with the stimulable phosphor sheet 51.

After the image has been read from the stimulable phosphor sheet 51, the light shutter 64 is closed and the mirror 57 is swung upwardly into the first position in the optical path of the light beam 52a. The erasing light source 56 is then energized to apply the erasing light 56a to the surface of the stimulable phosphor sheet 51 via the mirrors 57, 53c. Any residual image which may be left on the sheet 51 due to remaining electron beam energy after exposure of the sheet 51 to the stimulating light beam 52a, can be removed from the stimulable phosphor sheet 51, which can then be recycled.

Astigmatism produced by the electron microscope 1a on the electron microscope image can be detected and corrected as follows:

For astigmatism correction, a specimen 8 made entirely of an amorphous material such as carbon, silicon, or the like, or a specimen 8 of another material which is coated with a thin layer of such an amorphous material by vapor deposition, is employed. The specimen 8 is set on the specimen support 5, and the electron beam 2 is passed through the specimen 8 so as to impinge upon the stimulable phosphor sheet 51. The stimulable phosphor sheet 51 now stores the energy of the applied electron beam 2 which bears the magnified transmission image 8b of the specimen 8. Thereafter, the stimulable phosphor sheet 51 emits light upon exposure to the stimulating light, and the emitted light is photoelectrically detected by the photomultiplier 55 which produces an electric image signal S indicative of the magnified transmission image 8b.

The image signal S is applied to a Fourier transform circuit 25 which performs the Fourier transform electrically on the image signal S. A converted image signal S' issued from the Fourier transform circuit 25 represents a concentric ring pattern and is fed to an arithmetic circuit 26. If the image has no astigmatism, the ring pattern is of a normal circular shape, and if the image has astigmatism, the ring pattern is elliptical. The arithmetic circuit 26 then derives from the converted image signal S' the degree n of one ring R of the ring pattern (FIG. 6), the lengths s and l of the minor and major axes of the ring R, and the angle $\theta$ of inclination of the major axis (at which the astigmatism is present) with respect to a predetermined direction.

The lengths s and l of the minor and major axes of the ring R can be determined as by integrating the image density in the circumferential direction of the ring pattern, obtaining a density distribution histogram in a radiation direction, regarding the minimum point of the histogram as a point spaced a distance (radius) r from the center of the ring pattern, finding the distance r in a sufficient number of radial directions, and employing the minimum and maximum values of the distances r as the lengths s and l, respectively, of the minor and major axes. The degree n of the ring R can be ascertained by finding which one of a plurality of minimum points is the minimum point of the density distribution histogram representative of the radius r of the ring. The angle $\theta$ of inclination of the major axis is equal to the radiation direction giving the maximum value of the distance r.

The arithmetic circuit 26 computes the extent of astigmatism $\delta z$ from the degree n of the ring R, and the lengths s and l of the minor and major axes according to the equation (1). From the extent of astigmatism $\delta z$ and the angle $\theta$, the arithmetic circuit 26 then computes currents $\delta Ix$, $\delta Iy$ to be passed through a stigmeter 65 in the X- and Y-axis directions for eliminating the extent of astigmatism $\delta z$ according to the equations (2) and (3). The currents $\delta Ix$, $\delta Ix$ thus computed are displayed on a CRT 27, for example. The electron microscope operator now manually selects the currents $\delta Ix$, $\delta Iy$ for the stigmeter 65 as displayed for eliminating the astigmatism completely.

Instead of manually selecting the currents $\delta Ix$, $\delta Iy$ based on the information displayed on the CRT 27, there may be provided a driver device for the stigmeter 65 and a control device for the driver device, and the currents $\delta Ix$, $\delta Iy$ for the stigmeter 65 can automatically be selected by applying signals indicative of the currents $\delta Ix$, $\delta Iy$ computed by the arithmetic circuit 26 to the control device.

With the embodiment of FIG. 5, the extent of astigmatism can accurately be determined by an arithmetic operation on a signal produced electrically by the Fourier transform of an electric signal indicative of an electron microscope image, and currents to be passed through the stigmeter for eliminating the computed extent of astigmatism can also be computed to precision. Therefore, the astigmatism can accurately and reliably be eliminated even by an unskilled operator.

Although certain preferred embodiments have been shown and described, it should be understood that many changes and modifications may be made therein without departing from the scope of the appended claims.

We claim:

1. A method of detecting a defocus value of an image produced by an electron microscope, comprising the steps of:
   (i) exposing a two-dimensional image sensor under vacuum to an electron beam having passed through a specimen to enable said two-dimensional image sensor to store the energy of the electron beam;
   (ii) applying stimulating energy to said two-dimensional image sensor to discharge the stored energy as light;
   (iii) photoelectrically detecting the light discharged from said two-dimensional image sensor to produce an image signal; and
   (iv) computing the defocus value of the image based on said image signal.

2. A method according to claim 1, wherein the light discharged from said two-dimensional image sensor is detected while said two-dimensional image sensor is placed under vacuum.

3. A method according to claim 1, wherein said two-dimensional sensor comprises a stimulable phosphor sheet for discharging stimulated emission as said light respresenting the stored energy of the electron beam in response to exposure to said stimulating energy.

4. A method according to claim 1, wherein said stimulating energy is light.

5. A method according to claim 1, wherein said stimulating energy is heat.

6. A method according to claim 1, wherein the light discharged from said two-dimensional image sensor is photoelectrically detected in a portion of the frame of a final output image for observation of the specimen.

7. A method according to claim 1, wherein the light discharged from said two-dimensional image sensor is photoelectrically detected as larger pixels than those for the discharged light to be photoelectrically detected for producing a final output image for observation of the specimen.

8. A method of correcting astigmatism of an image produced by an electron microscope with a stigmeter, comprising the steps of:
   (i) exposing a two-dimensional image sensor under vacuum to an electron beam having passed through an amorphous material to enable said two-dimensional image sensor to store the energy of the electron beam;
   (ii) applying stimulating energy to said two-dimensional image sensor to discharge the stored energy as light;
   (iii) photoelectrically detecting the light discharged from said two-dimensional image sensor to produce an image signal;
   (iv) electrically performing the Fourier transform on the discharged light to produce a converted image signal bearing a ring pattern;
   (v) computing the degree of one ring of said ring pattern, the lengths of minor and major axes of said one ring, and the angle of inclination of said major axis, based on said converted image signal; and
   (vi) computing currents to be passed through said stigmeter based on said computed degree, lengths, and angle of inclination.

9. A method according to claim 8, wherein the light discharged from said two-dimensional image sensor is detected while said two-dimensional image sensor is placed under vacuum.

10. A method according to claim 8, wherein said two-dimensional sensor comprises a stimulable phosphor sheet for discharging stimulated emission as said light representing the stored energy of the electron beam in response to exposure to said stimulating energy.

* * * * *